(12) United States Patent
Lee

(10) Patent No.: US 6,333,667 B2
(45) Date of Patent: Dec. 25, 2001

(54) ANTIFUSE PROGRAMMING CIRCUIT

(75) Inventor: Jun-Keun Lee, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/739,294

(22) Filed: Dec. 19, 2000

(30) Foreign Application Priority Data

Dec. 29, 1999 (KR) .................................................. 99-65008

(51) Int. Cl.[7] .......................... H01H 37/76; H01H 85/00
(52) U.S. Cl. ........................................................ 327/525
(58) Field of Search ............................... 327/525; 365/96, 365/225.7; 257/529, 530

(56) References Cited

U.S. PATENT DOCUMENTS

| | | | |
|---|---|---|---|
| 5,793,224 | * 8/1998 | Sher | 327/537 |
| 6,054,893 | * 4/2000 | Singh | 327/525 |
| 6,144,247 | * 11/2000 | Kim et al. | 327/525 |
| 6,150,868 | * 11/2000 | Kim et al. | 327/525 |
| 6,240,033 | * 5/2001 | Yang et al. | 365/96 |
| 6,246,623 | * 6/2001 | Ingalls | 365/225.7 |

* cited by examiner

Primary Examiner—My-Trang Nu Ton
(74) Attorney, Agent, or Firm—Finnegan, Henderson, Farabow, Garrett & Dunner, L.L.P.

(57) ABSTRACT

An antifuse programming circuit for performing a programming operation without causing any stress to an antifuse element is provided. The antifuse programming circuit includes: an antifuse element which is programmable according to a voltage difference between both terminals thereof; a control logic circuit for generating a control signal in response to internal address signals and an external address signal; a negative voltage generator, coupled to the antifuse element, for generating a negative voltage signal; and a power connection controller, in response to the control signal, for coupling the negative voltage signal to a ground terminal when the antifuse element is in an unprogrammed state.

6 Claims, 2 Drawing Sheets

ANTIFUSE PROGRAMMING CIRCUIT

FIELD OF THE INVENTION

The present invention relates to a semiconductor device; and, more particularly, to an antifuse programming circuit for performing a programming operation without causing any stress to an antifuse element.

DESCRIPTION OF THE PRIOR ART

In FIG. 1, there is shown a schematic diagram of a conventional antifuse programming circuit.

The conventional antifuse programming circuit 10 includes a program signal generator 11, an antifuse element 12 and a diode-connected NMOS transistor 13. The program signal generator 11 provides a negative voltage signal used for programming the antifuse element 12. In an unprogrammed state, a node N between the antifuse element 12 and the diode-connected NMOS transistor 13 is set to a floating state.

When the negative voltage signal is provided to the node N, a voltage difference between two terminals of the antifuse element 12 is greatly large so that an insulating material used to form the antifuse element 12 is broken down. In the floating state, a negative threshold voltage, i.e., −Vt, is provided to the node N. Thus, the voltage difference between both terminals of the antifuse element 12 becomes very small, so that the insulating material is not broken down.

However, a successive stress is caused to the antifuse element 12 due to the negative threshold voltage. As a result, there is a problem that a life span of the antifuse element 12 is shortened.

SUMMARY OF THE INVENTION

It is, therefore, an object of the present invention to provide an antifuse programming circuit for performing a programming operation without causing any stress to an antifuse element.

In accordance with an aspect of the present invention, there is provided an antifuse programming circuit, comprising: an antifuse element, the antifuse element being programmable according to a voltage difference between both terminals thereof; a control logic means for generating a control signal in response to internal address signals and an external address signal; a negative voltage generation means, coupled to the antifuse element, for generating a negative voltage signal; and a power connection control means, in response to the control signal, for coupling the negative voltage signal to a ground terminal when the antifuse element is in an unprogrammed state.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
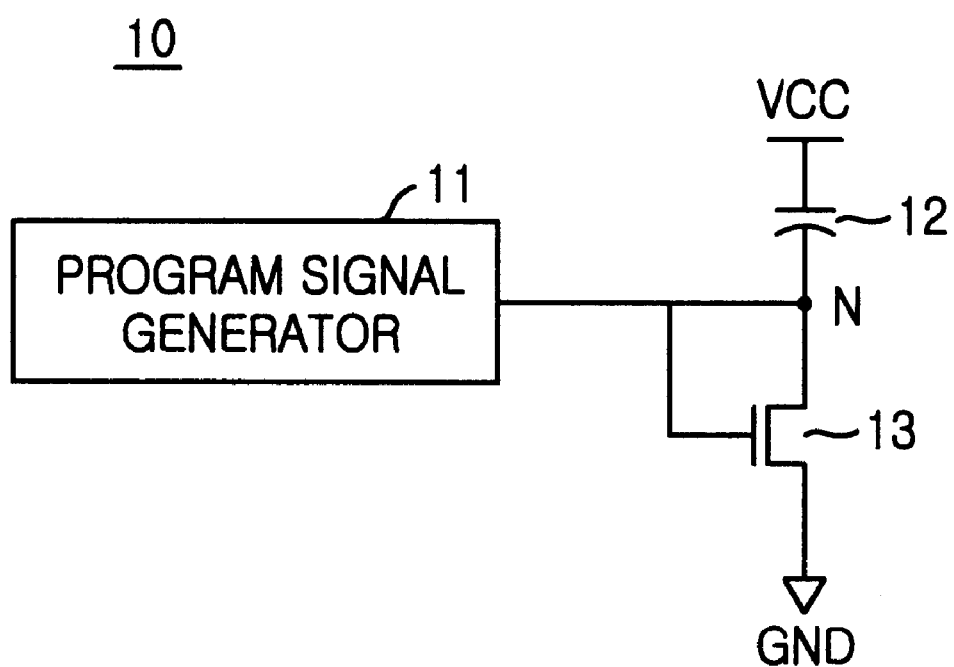
FIG. 1 is a schematic diagram showing a conventional antifuse programming circuit.
Figure 2:
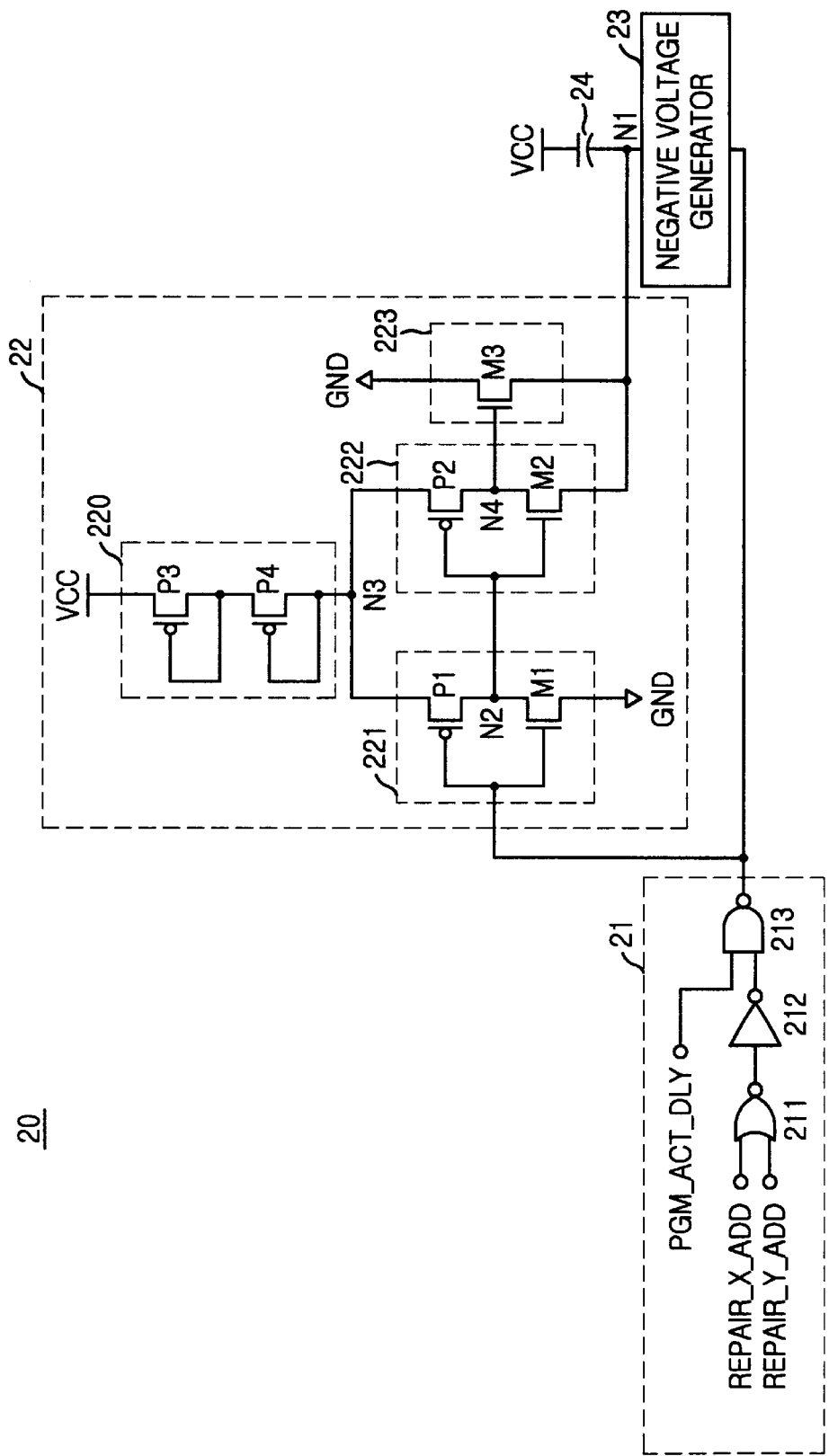
FIG. 2 is a schematic diagram illustrating an antifuse programming circuit in accordance with the present invention.

FIG. 2 is a schematic diagram illustrating an antifuse programming circuit in accordance with the present invention.

Referring to FIG. 2, the antifuse programming circuit 20 in accordance with the present invention includes a control logic circuit 21, a power connection controller 22, a negative voltage generator 23 and an antifuse element 24.

The power connection controller 22 and the negative voltage generator 23 are operated under a control of the control logic circuit 21. That is, in an unprogrammed state, an output of the negative voltage generator 23 is electrically coupled to a ground terminal GND via the power connection controller 22.

The control logic circuit 21 receives internal address signals REPAIR_X_ADD and REPAIR_Y_ADD and an external address signal PGM_ACT_DLY to generate a control signal for controlling an output of the negative voltage generator 23. The control logic circuit 21 includes a NOR gate 211 for NORing the internal address signals REPAIR_X_ADD and REPAIR_Y_ADD, an inverter 212 for inverting an output of the NOR gate 211, and a NAND gate 213 for NANDing the external address signal PGM_ACT_DLY and an output of the inverter 212.

The power connection controller 22 includes a pull down unit 220 for pulling down a power potential VCC, a first inversion unit 221, which is coupled to the pull down unit 220, for inverting the control signal, a second inversion unit 222, which is coupled to the pull down unit 220, for inverting an output of the first inversion unit 221, and a switching unit 223 for coupling the output of the negative voltage generator 23 in response to an output of the second inversion unit 222.

The pull down unit 220 is implemented with a plurality of diode-connected PMOS transistors P3 and P4 that are serially coupled between a power terminal VCC and the first inversion unit 221.

The switching unit 223 is implemented with an NMOS transistor M3, coupled between the power terminal VCC and the antifuse element 24, whose gate receives an output of the second inversion unit 222.

In case where the control logic circuit 21 provides the control signal of a high level, the first inversion unit 221 outputs a low level signal via an output node N2 so that a PMOS transistor P2 contained in the second inversion unit 222 is turned on. As a result, a voltage level of a node N3 is transferred to an output node N3 of the second inversion unit 222 via a turned-on PMOS transistor P2.

At this time, if an external power potential is directly applied to a gate of the NMOS transistor M3 contained in the switching unit 223 and the negative voltage signal is applied to a source of the NMOS transistor M3, a voltage difference between the gate and the source becomes greatly large so that the NMOS transistor M3 is broken down. This phenomenon can be prevented by employing the pull down unit 220.

The voltage level of the node N3 is reduced in proportion to the number of diode-connected PMOS transistors. As a result, a reduced voltage level is applied to the gate of the NMOS transistor M3 so that the NMOS transistor M3 is correctly operated.

That is, the NMOS transistor M3 is turned on in response to the output of the second inversion unit 222 so that the output of the negative voltage generator 23 is electrically coupled to the ground terminal GND. Therefore, an undesired stress caused due to the negative threshold voltage can be prevented.

In case where the control logic circuit 21 provides the control of a low level, an NMOS transistor M1 and a PMOS transistor P1 contained in the first inversion unit 221 are turned off and on, respectively. Thus, a voltage level of the node N3 is transferred to the output node N2 of the first inversion unit 221.

Then, a voltage level that is pulled down through the pull down unit 220 is applied to the gate of the NMOS transistor M2 so that the NMOS transistor M2 is turned on. Since the negative voltage signal is applied to the gate of the NMOS transistor M3 via a turned-on NMOS transistor M2, the negative voltage signal is isolated from the ground terminal GND and the antifuse element 24 is programmed.

As described above, the antifuse programming circuit 20 in accordance with the present invention can prevent the stress to the antifuse element by coupling the negative voltage signal to the ground terminal in an unprogrammed state, thereby increasing a lift span of the antifuse element.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An antifuse programming circuit, comprising:
    an antifuse element being programmable according to a voltage difference between both terminals thereof;
    a control logic means for generating a control signal in response to internal address signals and an external address signal;
    a negative voltage generation means, coupled the antifuse element, for generating a negative voltage signal; and
    a power connection control means, in response to the control signal, for coupling the negative voltage signal to a ground terminal when the antifuse element is in an unprogrammed state.

2. The antifuse programming circuit as recited in claim 1, wherein the power connection control means includes:
    a pull down means for pulling down a power potential;
    a first inversion means, coupled to the pull down means, for inverting the control signal;
    a second inversion means, coupled to the pull down means, for inverting an output of the first inversion means; and
    a switching means for performing a switching operation in response to an output of the second inversion means to couple the negative voltage signal to the ground terminal.

3. The antifuse programming circuit as recited in claim 2, wherein the pull down means includes a plurality of diode-connected transistors that are serially coupled between a power terminal and the first inversion means.

4. The antifuse programming circuit as recited in claim 3, wherein the diode-connected transistors are PMOS transistors.

5. The antifuse programming circuit as recited in claim 4, wherein the switching means is an NMOS transistor, coupled between the power terminal and the antifuse element, whose gate receives an output of the second inversion means.

6. The antifuse programming circuit as recited in claim 2, wherein the control logic means includes:
    a NOR gate for NORing the internal address signals;
    an inverter for inverting an output of the NOR gate; and
    a NAND gate for NANDing an output of the inverter and the external address signal to generate the control signal.

* * * * *

UNITED STATES PATENT AND TRADEMARK OFFICE
CERTIFICATE OF CORRECTION

PATENT NO.     : 6,333,667 B2
DATED          : December 25, 2001
INVENTOR(S)    : Jun-Keun Lee It is certified that error appears in the above-identified patent and that said Letters Patent is hereby corrected as shown below:

<u>Column 3,</u>
Line 31, "coupled the" should read -- coupled to the --.

Signed and Sealed this

First Day of July, 2003

JAMES E. ROGAN
*Director of the United States Patent and Trademark Office*